(12) United States Patent
Hembree et al.

(10) Patent No.: US 6,614,003 B2
(45) Date of Patent: *Sep. 2, 2003

(54) METHOD AND PROCESS OF CONTACT TO A HEAT SOFTENED SOLDER BALL ARRAY

(75) Inventors: David R. Hembree, Boise, ID (US); Warren M. Farnworth, Nampa, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

This patent is subject to a terminal disclaimer.

(21) Appl. No.: 10/196,396

(22) Filed: Jul. 15, 2002

(65) Prior Publication Data

US 2002/0179584 A1 Dec. 5, 2002

Related U.S. Application Data

(63) Continuation of application No. 09/892,156, filed on Jun. 26, 2001, now Pat. No. 6,420,681, which is a continuation of application No. 09/618,885, filed on Jul. 18, 2000, now Pat. No. 6,329,637, which is a continuation of application No. 09/145,832, filed on Sep. 2, 1998, now Pat. No. 6,121,576.

(51) Int. Cl.[7] ............................................. H01L 21/603
(52) U.S. Cl. ........................ 219/209; 219/243; 219/85.1; 219/85.22; 228/180.22; 228/193; 324/765
(58) Field of Search ................................ 219/209, 243, 219/85.1, 85.22; 228/180.22, 193; 324/765, 158.1, 760; 438/106

(56) References Cited

U.S. PATENT DOCUMENTS

| 4,332,341 A | 6/1982 | Minetti |
| 4,371,912 A | 2/1983 | Guzik |
| 4,638,348 A | 1/1987 | Brown et al. |
| 4,761,681 A | 8/1988 | Reid |
| 4,841,355 A | 6/1989 | Parks |
| 4,868,712 A | 9/1989 | Woodman |
| 4,956,694 A | 9/1990 | Eide |
| 5,010,233 A | 4/1991 | Henschen et al. |
| 5,012,323 A | 4/1991 | Farnworth |
| 5,128,831 A | 7/1992 | Fox, III et al. |
| 5,172,049 A | 12/1992 | Kiyokawa et al. |
| 5,231,304 A | 7/1993 | Solomon |
| 5,239,447 A | 8/1993 | Cotues et al. |
| 5,311,401 A | 5/1994 | Gates, Jr. et al. |
| 5,313,096 A | 5/1994 | Eide |
| 5,373,189 A | 12/1994 | Massit et al. |
| 5,384,689 A | 1/1995 | Shen |
| 5,397,997 A | 3/1995 | Tuckerman et al. |
| 5,616,958 A | 4/1997 | Laine et al. |
| 5,625,221 A | 4/1997 | Kim et al. |
| 5,637,536 A | 6/1997 | Val |
| 5,639,695 A | 6/1997 | Jones et al. |
| 5,639,696 A | 6/1997 | Liang et al. |

(List continued on next page.)

FOREIGN PATENT DOCUMENTS

| JP | 56-59234 | 5/1981 |
| JP | 60-194548 | 3/1985 |
| JP | 3-132093 | 6/1991 |
| JP | 5-82956 | 4/1993 |
| JP | 7-176567 | 7/1995 |
| JP | 10-117065 | 5/1998 |
| JP | 11-112133 | 4/1999 |

*Primary Examiner*—John A. Jeffery
(74) *Attorney, Agent, or Firm*—TraskBritt

(57) ABSTRACT

A method for enhancing temporary solder ball connection comprises the application of thermal energy to the solder balls, heating them to a submelting "softening" temperature, whereby the compression force required to connect all balls in a BGA is achieved at much reduced force, avoiding damage to the package, insert, substrate and support apparatus. Several forms of heating apparatus, and temperature measuring apparatus are disclosed.

59 Claims, 5 Drawing Sheets

U.S. PATENT DOCUMENTS

| | | |
|---|---|---|
| 5,642,261 A | 6/1997 | Bond et al. |
| 5,648,679 A | 7/1997 | Chillara et al. |
| 5,668,405 A | 9/1997 | Yamashita |
| 5,677,566 A | 10/1997 | King et al. |
| 5,686,318 A | 11/1997 | Farnworth et al. |
| 5,834,945 A | 11/1998 | Akram et al. |
| 5,911,897 A | 6/1999 | Hamilton |
| 6,121,576 A | 9/2000 | Hembree et al. |
| 6,329,637 B1 | 12/2001 | Hembree et al. |
| 6,420,681 B1 * | 7/2002 | Hembree et al. ........... 219/209 |

* cited by examiner

METHOD AND PROCESS OF CONTACT TO A HEAT SOFTENED SOLDER BALL ARRAY

CROSS-REFERENCE TO RELATED APPLICATIONS

This application is a continuation of application Ser. No. 09/892,156, filed Jun. 26, 2001, now U.S. Pat. No. 6,420,681 B1, issued Jul. 16, 2002, which is a continuation of application Ser. No. 09/618,885, filed Jul. 18, 2000, now U.S. Pat. No. 6,329,637 B1, issued Dec. 11, 2001, which is a continuation of application Ser. No. 09/145,832, filed Sep. 2, 1998, now U.S. Pat. No. 6,121,576, issued Sep. 19, 2000.

BACKGROUND OF THE INVENTION

1. Field of the Invention

This invention relates generally to semiconductor chip packages. More particularly, the present invention pertains to methods for electrical contact of an array of solder balls with a noncompliant surface.

2. State of the Art

The testing of packaged semiconductor devices has always presented problems to device manufacturers. Various types of tests may be conducted at different stages of manufacture. In the current state of the art, "wafer sort" electrical tests may be conducted prior to packaging to determine nonworking dies. Following packaging, various tests including environmental tests as well as parametric and functional electrical tests may be performed. A final test which is known as "burn-in" may optionally be conducted. The test includes temperature cycling over an extended period of time. Essential to the testing of individual dies is reliable electrical connection of all die leads to the test board, without incurring damage to the die or testing apparatus, and easy disassembly from the testing apparatus. While "permanent" wire connections are widely used, wire-bonding is time consuming and expensive, and also makes the matching of device impedance to the substrate impedance very difficult to achieve. Much effort is being spent on developing alternative methods to reduce the time and expense of using wire bonds. The replacement of wire bonds with ball grid array (BGA) connections is becoming more common. Temporary conductive attachment of solder balls to e.g. a test board is less than satisfactory.

Temporary connection of device circuits to a test apparatus is known to present a variety of problems. The insert member into which a semiconductor die is placed for testing is typically noncompliant, i.e. ceramic or silicon, for example.

The current method for joining a ball grid array (BGA) to a noncompliant, i.e. rigid surface such as a silicon micromachined pocket interconnect or insert, is to apply, at ambient temperature, a relatively high compression force of about 22–30 grams-force per solder ball. Theoretically, all balls of the array should be pressed into mechanical and electrical contact with the insert pocket. The use of compressive forces lower than the above results in a further increased frequency of unsatisfactory electrical connections.

The presence of such unconnected solder balls in a BGA attachment formed under ambient conditions is believed to be due to a significant variability in ball diameter and "height" which the industry has been unable to eliminate. As a result, the applied force of about 22–30 grams-force or even more per ball is, in practice, insufficient to ensure the required contact of all balls of the array. Furthermore, the use of compression forces in excess of about 30 grams-force tends to damage the underlying material of the die, insert, and/or substrate. For example, effective connection of a 48 ball BGA array using solder balls of a nominal diameter may require in excess of about 1.5 kg-force. Such pressures exerted on a die for connection to a ceramic insert may damage the die and/or insert and/or substrate below the insert. The total force required for connection of larger arrays will be even more. In addition, the use of larger balls not only increases the absolute variation in ball diameter but the force required to sufficiently deform each ball for establishing the required temporary electrical connection. The problem also exists with smaller solder balls such as comprise a fine ball-grid-array (FBGA) of 0.0125 inches (0.325 mm) diameter balls, for example. With the smaller diameter solder balls, variation in ball placement location may have a greater effect than nonuniform ball diameters.

To date, the industry has continued to use relatively high compressive forces and necessarily accepted the increased occurrence of electrical connection failures of a BGA and/or damage to the die, insert or substrate.

Ball grid arrays are used in a variety of semiconductor devices. Illustrative of such prior art are U.S. Pat. No. 5,642,261 of Bond et al., U.S. Pat. No. 5,639,695 of Jones et al., U.S. Pat. No. 5,616,958 of Laine et al., U.S. Pat. No. 5,239,447 of Cotues et al., U.S. Pat. No. 5,373,189 of Massit et al., and U.S. Pat. No. 5,639,696 of Liang et al.

Semiconductor devices having dual sets of outer "leads", e.g. twin BGA surfaces or a combination of e.g. J-leads and solder bumps, are shown in U.S. Pat. No. 5,648,679 of Chillara et al., U.S. Pat. No. 5,677,566 of King et al., and U.S. Pat. No. 5,668,405 of Yamashita.

Chip carriers of several configurations are described in U.S. Pat. No. 4,371,912 of Guzik, U.S. Pat. No. 4,638,348 of Brown et al., and Japanese publication 60-194548 (1985).

Semiconductor devices joined in stacks are disclosed in U.S. Pat. No. 4,868,712 of Woodman, U.S. Pat. No. 4,841,355 of Parks, U.S. Pat. No. 5,313,096 of Eide, U.S. Pat. No. 5,311,401 of Gates, Jr. et al., U.S. Pat. No. 5,128,831 of Fox, III et al., U.S. Pat. No. 5,231,304 of Solomon, and U.S. Pat. No. 4,956,694 of Eide.

U.S. Pat. No. 5,637,536 of Val discloses a chip stacking configuration with solder ball connections.

U.S. Pat. No. 5,012,323 of Farnworth discloses a dual-die package having wire interconnections.

U.S. Pat. No. 4,761,681 of Reid discloses a multi-chip device having elevated (conductor covered mesa) interconnections.

Despite the advanced state of the art in lead interconnection, device packaging and testing, the temporary connection of semiconductor devices to testing apparatus and burn-in boards remain area which needs improvement.

BRIEF SUMMARY OF THE INVENTION

The present invention pertains to methods for electrical contact of an array of solder balls with a noncompliant surface, that is, the mechanical and electrical contact of a ball grid array (BGA) to a relatively noncompliant contact set such as a silicon micromachined pocket interconnect (i.e. "insert") for a test pad or burn-in board (BIB).

The present invention further provides a reliable BGA connection method and apparatus whereby the required pressure is much reduced to eliminate or significantly reduce compression-caused damage to the die, insert and/or substrate.

The present invention comprises methods and apparatus for softening solder bumps or balls so that all of the bumps/balls in an array readily conform to a matching array of conductive contact pockets or pads in another body. The array of solder bumps/balls is heated to a softening temperature lower than the melting point of the solder and quickly placed in slightly compressed engagement with the contact pockets or pads of a substrate. As compared to joining the arrays at ambient temperature, all bumps/balls of the BGA are reliably connected, and the connection is achieved at a much reduced pressure, avoiding damage to the die and/or substrate. In addition, much less stress is placed on the apparatus holding the packaged die, the insert and test board.

The softening temperature to which the solder is heated is below the melting temperature of the solder alloy.

A variety of heating apparatus and methods is disclosed, including direct heating of the bumps/balls, heating of the entire assembly, heating of a chuck holding the IC, heating of a chuck holding the insert, direct heating of the insert or substrate, etc. A temperature sensing circuit may also be incorporated into the insert, substrate, or substrate retaining socket for the purpose of measuring and controlling the temperature to which the bumps/balls are heated.

While electrical contact is readily maintained during electrical tests or burn-in by maintaining a small compressive force, ball contact is easily removed by discontinuing the compressive force and lifting the BGA from the insert or substrate to which it was electrically connected.

The invention is applicable to a wide variety of solder compositions, solder bump designs and ball diameters.

Other features of the invention will become clear from study of the following description and related figures.

BRIEF DESCRIPTION OF THE SEVERAL VIEWS OF THE DRAWINGS

The invention is illustrated in the following figures, wherein the elements are not necessarily shown to scale.

DETAILED DESCRIPTION OF THE INVENTION

The present invention relates to method and apparatus embodiments for the uniform temporary electrical connection of solder bumps, e.g. solder balls, of a semiconductor device to another body. Rapid thermal softening of the solder bumps may be achieved by a variety of specific methods and apparatus, as described herein. The methods are particularly useful for attachment of solder bumps to the surface of a noncompliant body such as formed of silicon, ceramic, etc.

Figure 1:
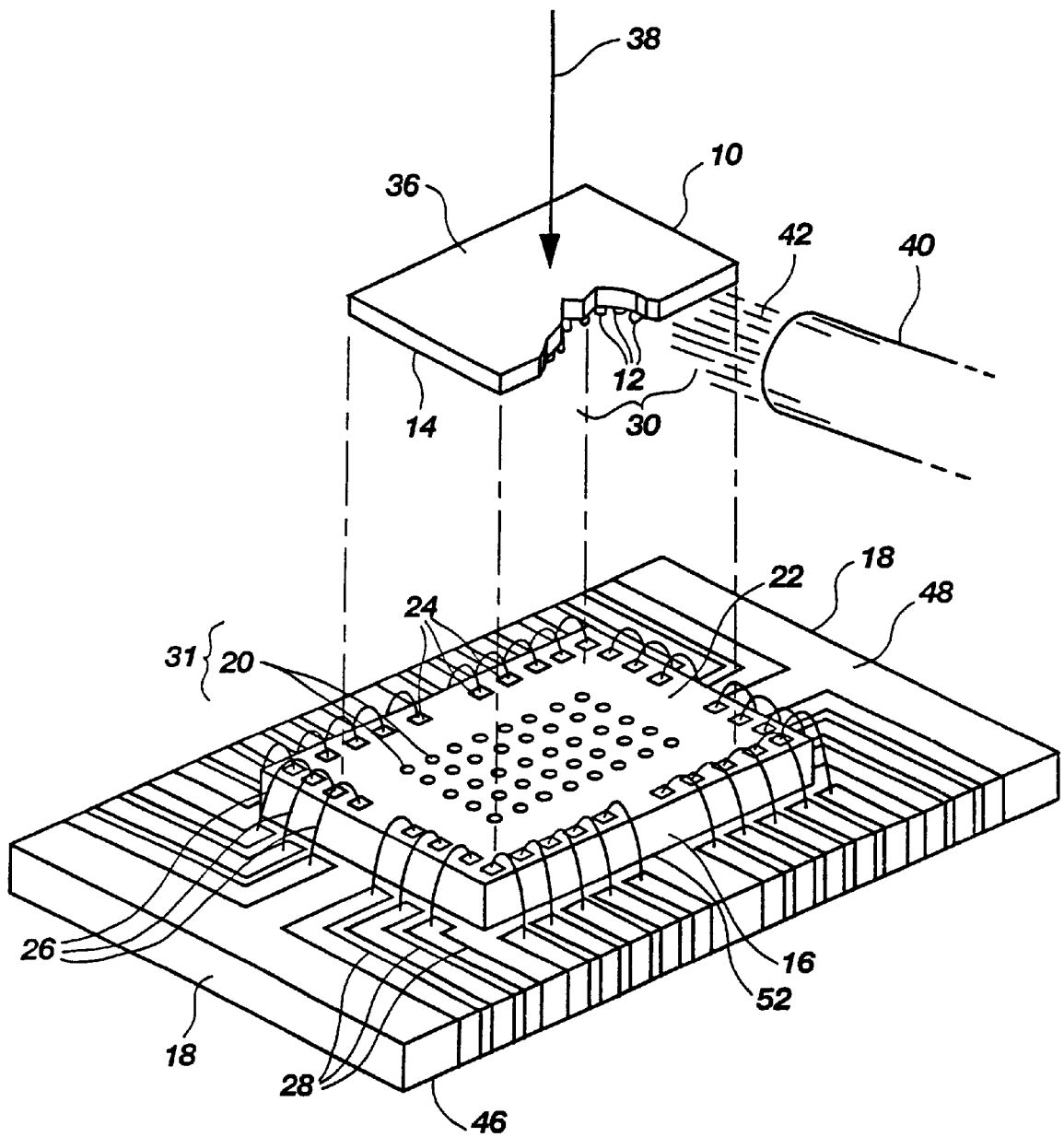
FIG. 1 is a perspective view of an insert assembly for the electrical testing of a typical flip-chip semiconductor package with BGA, wherein heat enhancement of the BGA connection in accordance with the invention is shown.

As shown in drawing FIG. 1, a semiconductor package 10 is exemplified by a flip-chip package (FCP) with a ball grid array (BGA) 30 of a plurality of solder bumps or balls 12 on one surface 14 of the semiconductor package 10.

A test apparatus for evaluating circuit performance of the semiconductor package 10 is shown as including an insert 16 and a substrate member 18. The insert 16 is noncompliant and is typically formed of ceramic or silicon with a pattern of electrical contact sites 20 micromachined on its upper surface 22. The contact sites 20 may comprise simple planar pads, or contact pockets of any configuration, as explained infra. The contact sites 20 are connected by conductive traces, not visible, to bond pads 24, the latter being connected by wire bonds 26 to conductive traces 28 on the substrate member 18. The wire bonds 26 and traces 28 on the insert 16 and substrate member 18 may be encapsulated in resin for protection. Other means for connecting the contact sites 20 to a controller conducting a test, burn-in, etc. may be used, as known in the art.

The substrate member 18 and attached insert 16 are typically inserted into a socket on a test fixture or a burn-in-board (BIB), neither shown in drawing FIG. 1.

In accordance with the invention, the ball grid array 30 of solder bumps/balls 12 is heated and compressed under a slight pressure into the contact sites 20, shown here as indentations or pockets. The solder bumps/balls 12 are heated to a submelting softening temperature $T_s$ and are uniformly contactable to the contact sites 20 by an increased deformation under the slight compression force.

Figure 1A:
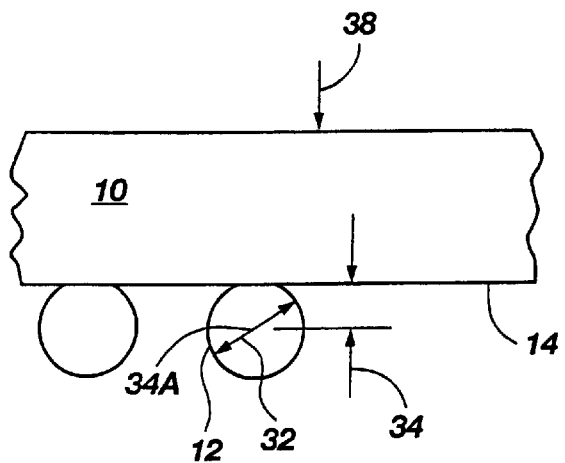
FIG. 1A is an edge view of a ball grid array on a semiconductor chip.

In one simple embodiment, an external heater 40 emitting infrared radiation or heated air 42 is positioned to heat the semiconductor package 10 including the solder bumps/balls 12 to the desired softening temperature, and the BGA 30 is quickly inserted and compressed by force 38 into engagement with the contact sites 20 at a relatively low pressure such as about 2–10 g-force per solder bump/ball 12. Referring to drawing FIG. 1A, of course, the required force per solder bump/ball 12 will vary, depending upon the softening characteristics of the particular solder composition used, the temperature to which the solder bumps/balls 12 are heated, the nominal ball diameter 32, the maximum variation in ball diameter 32 and the variation in drop distance 34 between ball centers 34A and the surface 14 of semiconductor package 10. Typically, the required force 38 at the softening temperature $T_s$ to achieve complete ball connection is about 8–25 percent of the force at ambient temperature.

Instead of directly heating the semiconductor package 10 to soften the solder bumps/balls 12, heat may be applied to the insert 16 or substrate member 18 before connecting the BGA 30 to the contact sites 20. Also, the semiconductor package 10 may be indirectly heated by applying thermal energy to a chuck, not shown, which holds the package.

Figure 2:
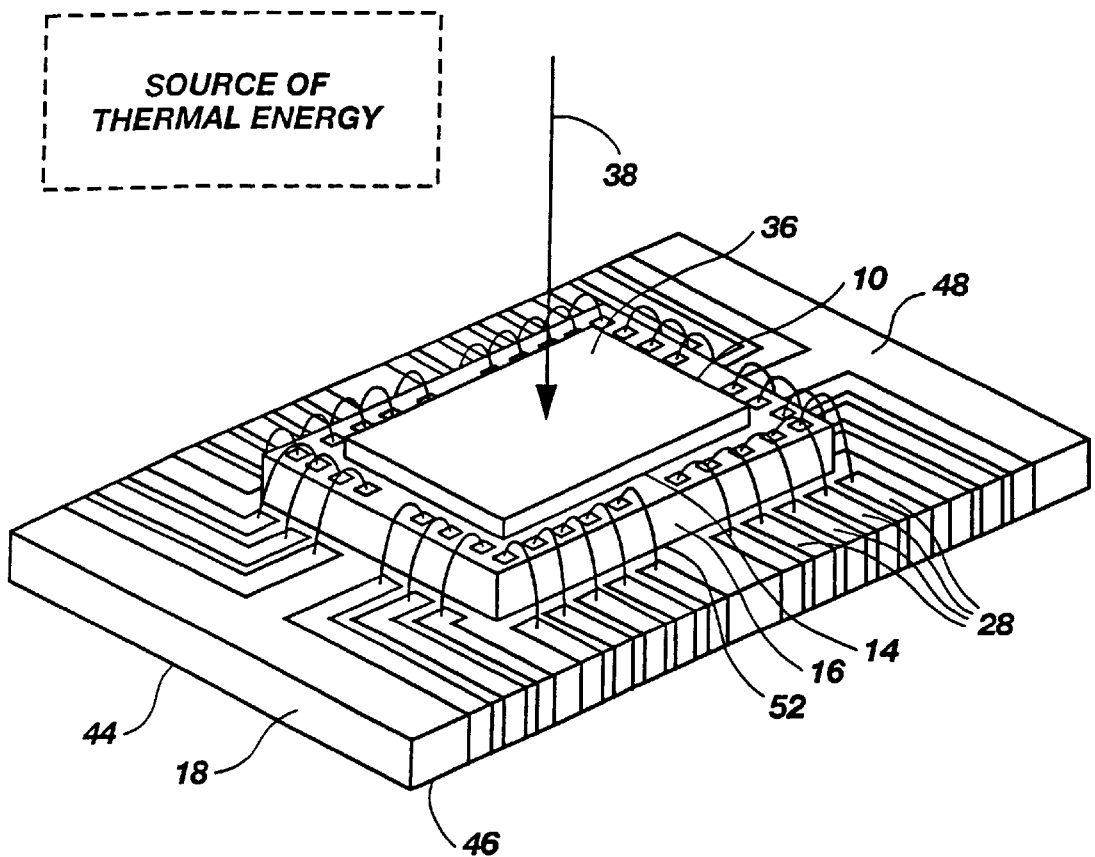
FIG. 2 is a perspective view of an insert assembly for the electrical testing of a typical flip-chip semiconductor package with BGA, showing the package in compressive engagement with the insert assembly for heating enhancement of the BGA connection in accordance with the invention.
Figure 5:
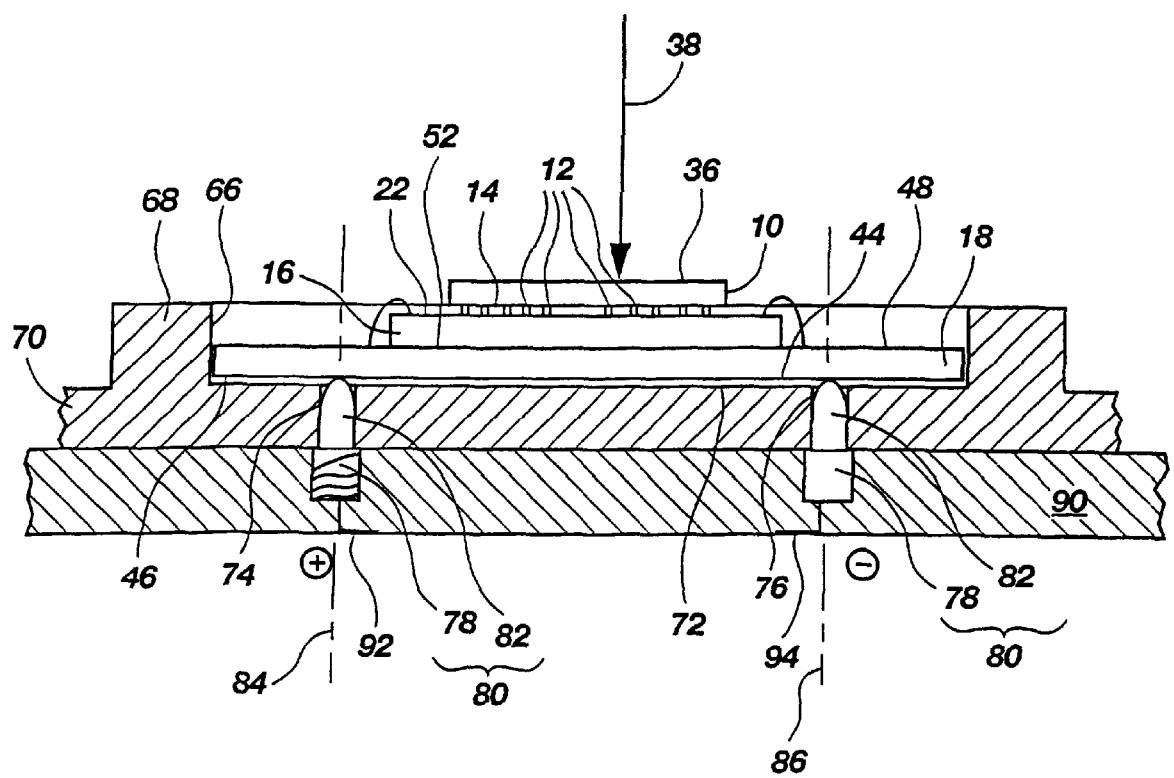
FIG. 5 is a cross-sectional view of a portion of a heating assembly of the invention.
Figure 4:
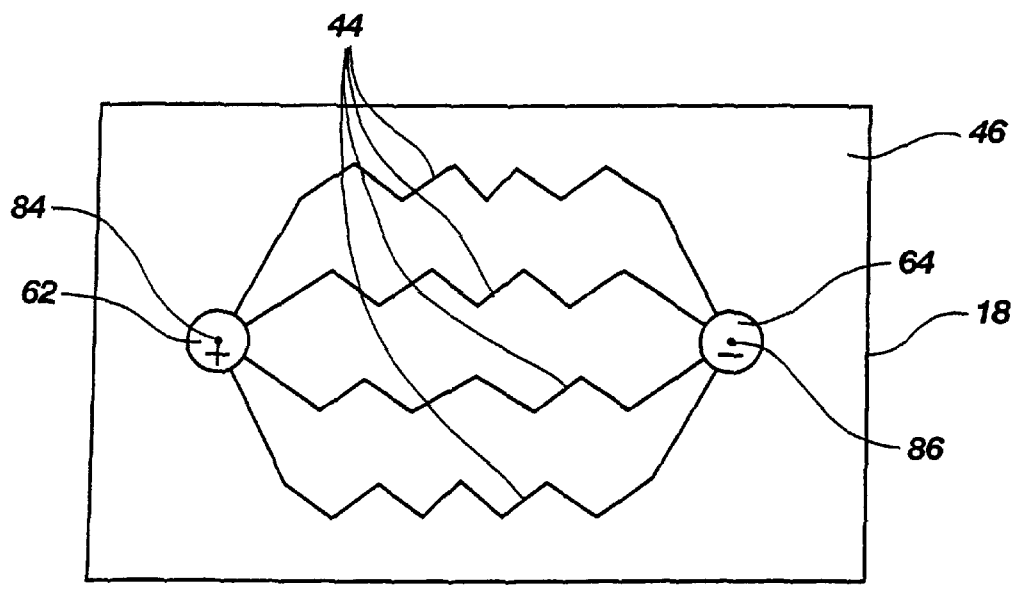
FIG. 4 is a bottom view of a substrate member of the invention.

As shown in drawing FIG. 2, a semiconductor package 10 with an array of solder bumps/balls 12 is placed on an insert 16, and placed under a compression force 38. Thermal energy is applied either to the back side 36 of the semiconductor package 10, to the insert 16, to the substrate member 18 (as shown in FIGS. 4 and 5), to a compression member, not shown, compressing the back side of the semiconductor package 10 with force 38, or to a socket, not shown, which surrounds the substrate.

Alternatively, the assembly of semiconductor package 10, insert 16 and substrate member 18, together with compression and support apparatus, may be placed in a temperature controlled oven and rapidly heated to the desired softening temperature $T_s$.

Thus, the solder bumps/balls 12 may be heated by conduction, convection or radiation, or any combination thereof. For example, an external heater 40 (FIG. 1) may heat the semiconductor package 10, insert 16, substrate member 18, or a socket into which the substrate member fits by radiation or heated air 42.

The solder bumps/balls 12 may be of any diameter 32, including those of a fine ball grid array (FBGA), where the balls have a pitch of less than one (1) mm.

The solder bumps/balls 12 may be formed of various solder compositions, including tin-lead solders having a lead content of about 30 to 98 percent. Solder compositions having the higher lead concentrations often have a higher melting point.

A softening temperature $T_s$ of about 130 to about 180 degrees C. has been found useful for reducing the compression force 38 to a relatively low value and simultaneously ensuring electrical contact of all solder bumps/balls 12.

Figure 3:
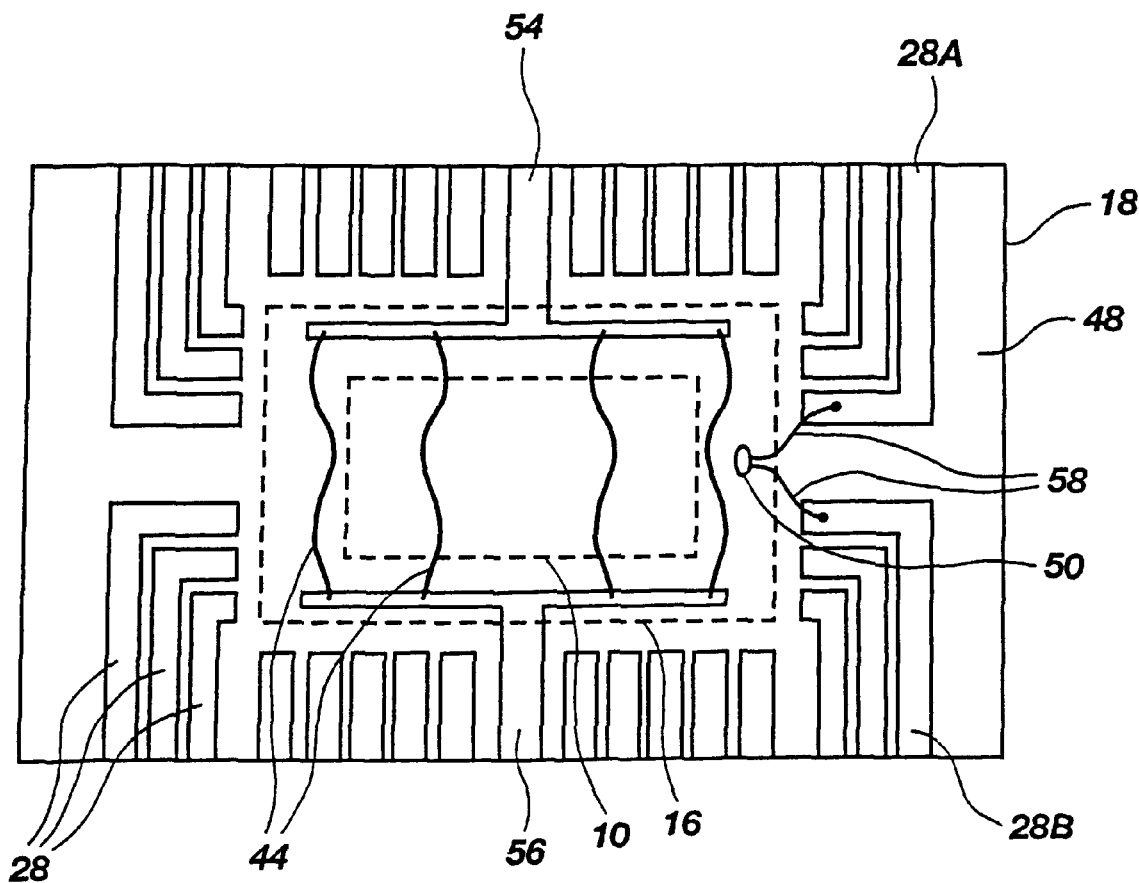
FIG. 3 is a plan view of a substrate member of the invention.

As shown in drawing FIG. 3, resistive heating elements 44 may be applied to the top surface 48 of the substrate member 18, preferably under the insert 16 and substantially beneath the semiconductor package 10. The heating elements 44 are shown as having power leads 54, 56 for providing sufficient power to quickly heat the insert 16 including the electrical contact sites 20, not shown, and the solder bumps/balls 12, not shown, which are in engagement with the contact sites 20.

All of the conductive traces on substrate member 18, including conductive traces 28, heater power leads 54, 56, and heating elements 44 may be formed simultaneously by screening a thick film of conductive material onto the substrate member. This method of forming conductive traces on a surface is well known in the art.

A thermocouple junction 50 or other temperature detecting device may be installed in or on the insert 16 or substrate member 18 for obtaining temperature feedback and controlling the bump/ball temperature to attain a maximum desired softening temperature $T_s$. Thus, for example, as shown in drawing FIG. 3, a temperature sensor 50 (such as a thermocouple junction) may be fixed on the top surface 48 of the substrate member 18 or back side 52 (FIGS. 1 and 2) of the insert 16, and have thermocouple leads 58 connected through otherwise unused conductive traces 28A, 28B to measurement/control instrumentation, not shown. In use, a heater controller, not shown, determines the measured temperature and shuts off (or reduces) power to the heating elements 44 upon sensing a predetermined temperature. A recorder, not shown, may be used to calibrate the measurements such that a desired softening temperature may be precisely attained.

A short heating time is preferred, extending only several seconds or less. Most preferably, the heating time is less than one second. Thus, the power leads 54, 56 to the heating elements 44 must be sufficiently large to carry the necessary electrical load. In general, installation of the heating elements 44 on the insert 16 will require separate power leads 54, 56. Normally, wire bonds 26 (FIG. 1) are incapable of carrying the necessary load.

Another form of heating apparatus which may be used in the invention is illustrated in drawing FIGS. 4 and 5. The substrate member 18 has on its back side (underside) 46 a pattern of heating elements 44 with junctions 62, 64. The junctions 62, 64 may be planar pads or conductively surfaced indentations in the back side 46.

As shown in drawing FIG. 5, a semiconductor package 10, insert 16, and substrate member 18 are positioned in a socket 66 on a test board 70. Test board 70 may be a board for an electrical test, for burn-in, or other purpose. The socket 66 is typically formed with walls 68 and base 72, and many sockets 66 may be mounted on a single test board 70 to enable simultaneous testing or burn-in of many semiconductor packages 10.

A pair of through-holes 74, 76 is formed in the test board 70 along axes 84, 86, the axes which pass through junctions 62, 64, respectively. Two metal spring-loaded compression pins 80, also known as "pogo pins", are mounted in the test board 70 or in another substrate 90 underlying the test board. Substrate 90, having a plurality of pogo pins 80 projecting therefrom, is known as a bed-of-nails (BON). The pogo pins 80 have a base 78 and a spring loaded pin 82 which is axially movable relative to the base 78. The pins 82 are shown passing through-holes 74, 76 to electrically contact the junctions 62, 64 when in compression, power leads 92, 94 from the two pogo pins 80 providing sufficient electric power to the heating elements 44 for rapidly heating the solder bumps/balls 12. Following testing, the spring-loaded pogo pins 80 will push the substrate member 18 from the socket 66 with a short stroke.

Figure 6:
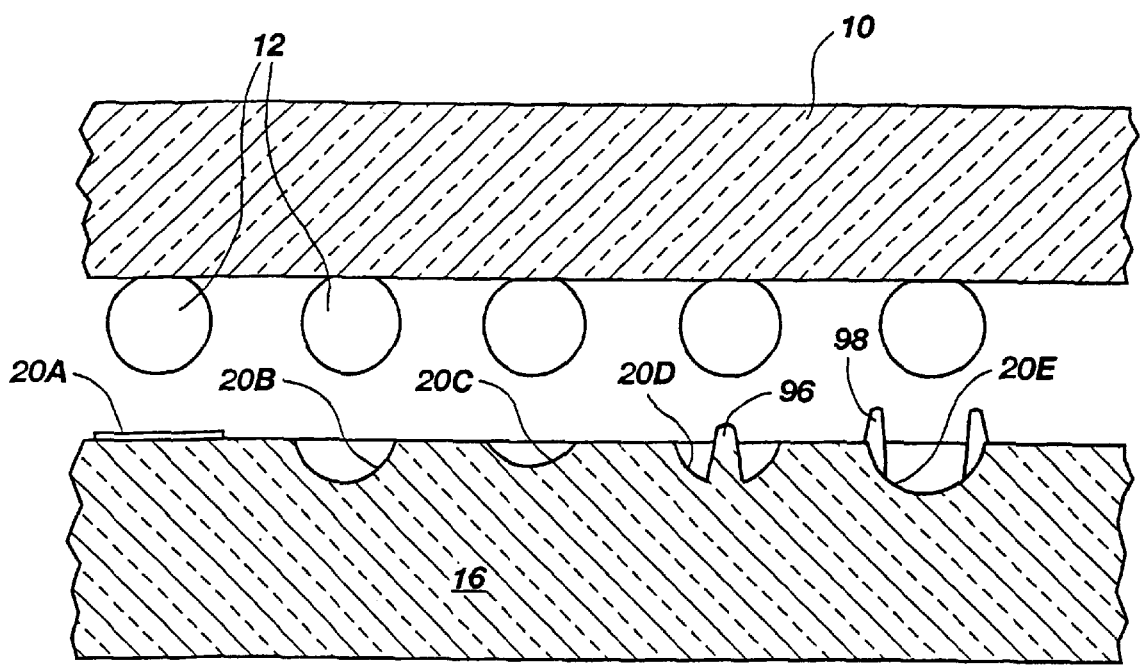
FIG. 6 is a cross-sectional view of various solder ball contact sites to which the invention may be applied.
Figure 1:
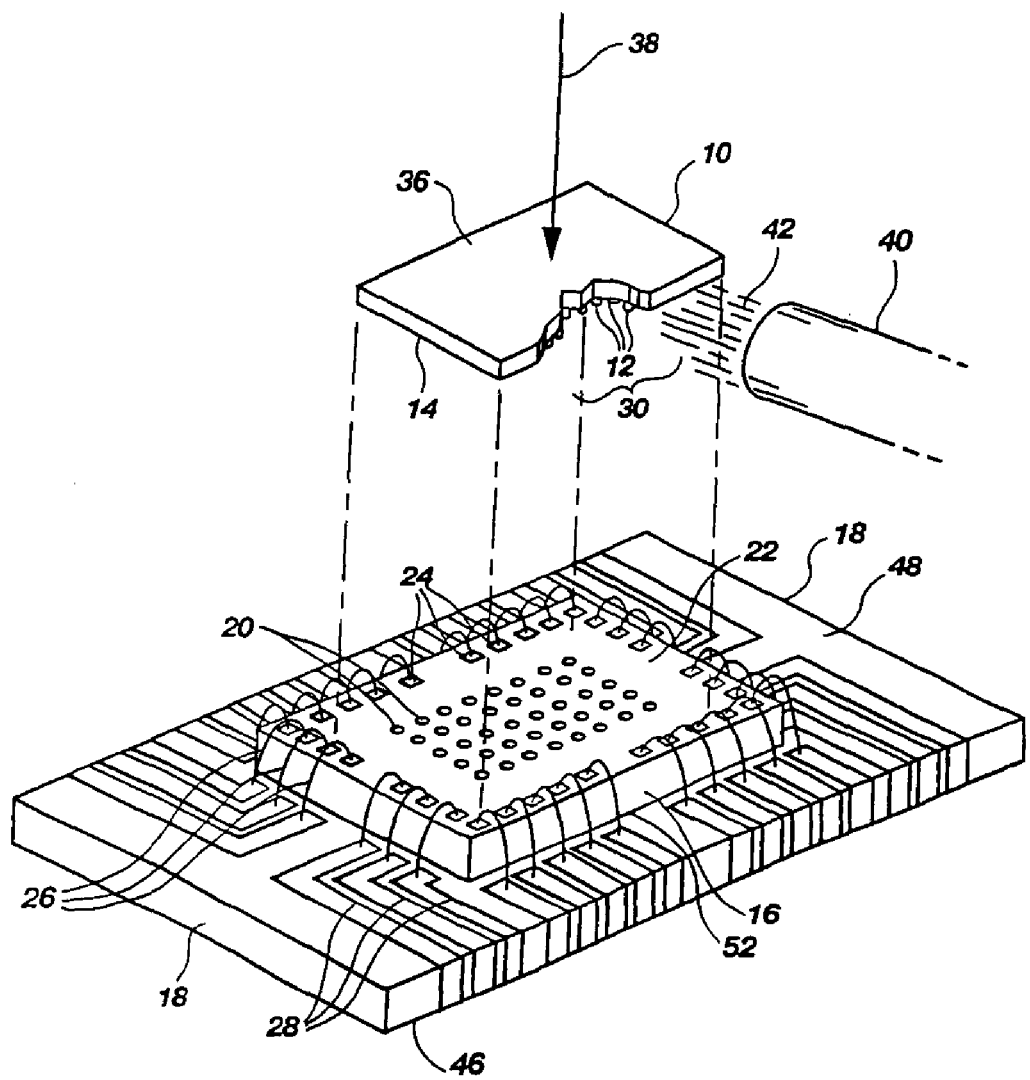

In drawing FIG. 6, several types of BGA contact sites 20 are shown as examples illustrating the wide variety of solder bumps/balls 12 and contact sites 20 combinations whose temporary connection is enhanced by use of an elevated submelting softening temperature $T_s$. Each solder bump/ball 12 attached to semiconductor package 10 is configured to be in compressive conductive contact with a contact site 20.

Contact site 20A comprises a flat pad or surface of the insert 16.

Contact site 20B is a spherical indentation in the insert 16.

Contact site 20C is a shallow spherical indentation.

Contact site 20D is a spherical indentation having a central axially directed projection 96 which punctures and enters the softened solder bump/ball 12. Preferably, the projection 96 is pyramidal in shape.

Contact site 20E is a spherical indentation having several, typically four, peripheral projections 98 which contact and are forced into the circumferential surface of the solder bump/ball 12.

The illustrated contact sites 20 to which the invention may be applied are exemplary only and not exhaustive.

It is clear that a wide variety of apparatus may be used for heating ball-grid-array connections, of which those described herein are representative.

The invention has been illustrated in application to the testing of a flip-chip device. However, the temporary BGA connection of any device, including other chip scale packages (CSP), is enhanced by this process and apparatus.

It is apparent to those skilled in the art that various changes and modifications, including variations in heating procedures and structures, may be made to the BGA connection method and apparatus of the invention as described herein without departing from the spirit and scope of the invention as defined in the following claims.

What is claimed is:

1. A method for connecting at least one solid conductive solder bump of an array of solid conductive solder bumps on a semiconductor device and at least one conductive contact site of a plurality of conductive contact sites of a member, comprising:

providing a semiconductor device having an array of solid conductive solder bumps;

providing a member having a plurality of conductive contact sites;

heating said at least one solid conductive solder bump of said array of solid conductive solder bumps to a softening temperature $T_s$ below a melting temperature of said at least one solid conductive solder bump of said array of solid conductive solder bumps; and contacting at least one conductive contact site of said plurality of conductive contact sites by said at least one solid conductive solder bump of said array of solid conductive solder bumps of said semiconductor device using a pressure less than substantially 22 grams-force for said at least one solid conductive solder bump and another solid conductive solder bump of said array of solid conductive solder bumps.

2. The method of claim 1, wherein said melting temperature of said array of solid conductive solder bumps is T degrees Centigrade higher than an ambient temperature $T_o$, and wherein said softening temperature $T_s$ is in the range of about 0.5T to 0.95T above said ambient temperature $T_o$.

3. The method of claim 1, wherein said at least one solid conductive solder bump of said array of solid conductive solder bumps contacts said at least one conductive contact site of said plurality of conductive contact sites at a pressure not substantially exceeding about 10 grams-force.

4. The method of claim 1, wherein said at least one solid conductive solder bump of said array of solid conductive solder bumps contacts said plurality of conductive contact sites at a pressure of in the range of about 2 to 10 grams-force.

5. The method of claim 1, wherein said semiconductor device having said array of solid conductive solder bumps is directly heated by one of hot air convection and infrared radiation.

6. The method of claim 1, wherein said member having said plurality of conductive contact sites is directly heated by one of hot air convection, conduction from a heated object, and infrared radiation.

7. The method of claim 1, wherein said semiconductor device and said member are placed in a temperature-controlled oven for heating to said softening temperature $T_s$.

8. The method of claim 1, wherein said semiconductor device is held in a chuck, said chuck being heated.

9. The method of claim 1, wherein said member is held in a chuck, said chuck being heated.

10. The method of claim 1, wherein said at least one solid conductive solder bump of said array of solid conductive solder bumps of said semiconductor device contacts said at least one conductive contact site of said plurality of conductive contact sites of said member being heated under compressive force to soften said at least one solid conductive solder bump of said array of solid conductive solder bumps for connection to said at least one conductive contact site of said plurality of conductive contact sites.

11. The method of claim 1, wherein said member having said plurality of conductive contact sites is heated by electrical resistance wires.

12. The method of claim 1, wherein said member and a substrate are mounted on a mounting board having an integral heater, said integral heater controlled to heat said member to said softening temperature $T_s$.

13. The method of claim 1, wherein said array of solid conductive solder bumps comprises Sn—Pb solder having a lead content in a range of about 40 to about 98 percent, and said softening temperature $T_s$ comprises a range of about 140 to 180 degrees C.

14. The method of claim 1, wherein said heating comprises predetermining a heating time X to heat said at least one solid conductive solder bump of said array of solid conductive solder bumps to said softening temperature $T_s$, and heating for said time X.

15. The method of claim 1, wherein said heating comprises initiating said heating, measuring a temperature of one of an insert, a die, and a substrate being heated, and stopping said heating to limit the temperature of said at least one solid conductive solder bump of said array of solid conductive solder bumps to no more than said softening temperature $T_s$.

16. A temporary method to attach at least one conductive solder bump of an array of conductive solder bumps on a semiconductor device to at least one conductive contact site of a plurality of conductive contact sites of a member, comprising:

providing a semiconductor device having an array of conductive solder bumps;

providing a member having a plurality of conductive contact sites;

heating said at least one conductive solder bump of said array of conductive solder bumps to a softening temperature $T_s$ below a melting temperature of said at least one conductive solder bump of said array of conductive solder bumps; and compressing said at least one conductive solder bump of said array of conductive solder bumps on said semiconductor device to at least one conductive contact site of said plurality of conductive contact sites at a pressure less than substantially 22 grams-force and another conductive solder bump of said array of conductive solder bumps.

17. The method of claim 16, wherein said melting temperature of said at least one conductive solder bump of said array of conductive solder bumps is T degrees Centigrade higher than an ambient temperature $T_o$, and wherein said softening temperature $T_s$ is in a range of about 0.5T to 0.95T above said ambient temperature $T_o$.

18. The method of claim 16, wherein said at least one conductive solder bump of said array of conductive solder bumps is compressed to said at least one conductive contact site of said plurality of conductive contact sites at a pressure not exceeding about 10 grams-force.

19. The method of claim 16, wherein said at least one conductive solder bump of said array of conductive solder bumps is compressed to said at least one conductive contact site of said plurality of conductive contact sites at a pressure in a range of about 2 to 10 grams-force.

20. The method of claim 16, wherein said semiconductor device having said array of conductive solder bumps is directly heated by one of hot air convection and infrared radiation.

21. The method of claim 16, wherein said member having said plurality of conductive contact sites is directly heated by one of hot air convection, conduction from a heated object, and infrared radiation.

22. The method of claim 16, wherein said semiconductor device and said member are placed in a temperature-controlled oven for heating to said softening temperature $T_s$.

23. The method of claim 16, wherein said semiconductor device is held and heated for heat transfer to said semiconductor device.

24. The method of claim 16, wherein said member is held and heated for heat transfer to said member to heat said at least one conductive contact site of said plurality of conductive contact sites.

25. The method of claim 16, wherein said at least one conductive solder bump of said array of conductive solder bumps of said semiconductor device is compressed to said at least one conductive contact site of said plurality of conductive contact sites of said member being heated under compressive force to soften said at least one conductive solder bump of said array of conductive solder bumps for connection to said at least one conductive contact site of said plurality of conductive contact sites.

26. The method of claim 16, wherein said member having said plurality of conductive contact sites is heated by electrical resistance wires.

27. The method of claim 16, wherein said member and a substrate are mounted on a mounting board having an integral heater, and said integral heater is controlled to heat said member to said softening temperature $T_s$.

28. The method of claim 16, wherein said array of conductive solder bumps comprises Sn—Pb solder having a lead content in a range of about 40 to about 98 percent, and said softening temperature $T_s$ comprises a range of about 140 to 180 degrees Centigrade.

29. The method of claim 16, wherein said heating comprises predetermining a heating time X to heat said array of conductive solder bumps to said softening temperature $T_s$, and heating for said time X.

30. The method of claim 16, wherein said heating comprises measuring a temperature of one of an insert, a die, and a substrate being heated, and stopping said heating to limit a temperature of said array of conductive solder balls to said softening temperature $T_s$.

31. An apparatus for temporarily connecting at least one solder ball to at least one conductive contact site, said apparatus comprising:
   a first member having at least one solder ball thereon;
   a second member having at least one conductive contact site;
   apparatus for moving said first member against said second member for contact of said at least one solder ball to said at least one conductive contact site, said first member contacting said second member at a pressure less than substantially 22 grams-force for said at least one solder ball; and
   heating apparatus for heating said at least one solder ball and said at least one conductive contact site to a submelting solder softening temperature $T_s$.

32. The apparatus of claim 31, wherein said at least one conductive contact site comprises a substantially flat surface.

33. The apparatus of claim 31, wherein said at least one conductive contact site comprises a recess for receiving a portion of a solder ball.

34. The apparatus of claim 31, wherein said at least one conductive contact site comprises a recess having at least one projection therein for deforming a solder ball inserted therein.

35. A testing apparatus for a semiconductor package having a ball grid array of solder balls on a surface thereof, said apparatus comprising:
   an insert formed of generally noncompliant material, said insert having a first surface including an array of conductive contact sites for contacting said ball grid array of solder balls, and having a second surface;
   a substrate having a first surface, having a second surface, said second surface of said insert secured to said first surface of said substrate, and having a pattern of conductive leads on said substrate for connecting to contact leads in a socket;
   electrical leads connecting said array of conductive contact sites of said insert with said pattern of conductive leads of said substrate;
   a test board having said socket with said contact leads connected to a testing circuit, said substrate and said insert insertable into said socket for contact of said pattern of conductive leads of said substrate with said contact leads of said socket; and
   heating apparatus associated with at least one of said substrate, said insert and said socket.

36. The apparatus of claim 35, further comprising:
   power supply leads providing electrical power to said heating apparatus.

37. The apparatus of claim 35, wherein said heating apparatus comprises resistance conductors.

38. The apparatus of claim 35, further comprising a switch apparatus for turning said heating apparatus on and off.

39. The apparatus of claim 35, further comprising temperature sensing apparatus attached to one of said substrate, said insert, and said semiconductor package.

40. The apparatus of claim 39, further comprising a temperature controller for controlling said heating apparatus.

41. The apparatus of claim 39, wherein said temperature sensing apparatus comprises a thermocouple junction.

42. The apparatus of claim 35, wherein said heating apparatus includes a conductive layer of metal deposited on one of said first and second surfaces of said substrate.

43. The apparatus of claim 36, wherein said heating apparatus, said power supply leads and said conductive leads are formed on said substrate.

44. A temporary connection apparatus for connecting at least one solder ball on a first member to a corresponding contact site on a second member, said second member connected to a third member, said apparatus comprising:
   a board having a socket thereon for accepting said first member, said second member, and said third member, said board having at least two through-holes extending therethrough;
   a heating conductor mounted on a side of said third member;
   at least two spring-loaded pogo pins mounted to project a pin portion thereof upwardly through each of said at least two through-holes for contacting said third member; and
   power leads connecting each pogo pin of said at least two spring-loaded pogo pins to a power supply for heating at least one of said first member, said second member, and said third member including said at least one solder ball and said corresponding contact site.

45. The apparatus of claim 44, further comprising a temperature sensor mounted within said first member, said second member, and said third member connected to a temperature measuring circuit.

46. A heating apparatus for heating at least one solder ball under a compression force at a conductive contact site for an electrical connection, said apparatus comprising:
   a first member having a surface having at least one solder ball thereon;
   a second member having a surface having an array of conductive contact sites;
   apparatus for compressing said first member against said second member for contacting said at least one solder ball with at least one conductive contact site of said array of conductive contact sites, said first member compressed against said second member at a pressure less than substantially 22 grams-force per solder ball; and heating apparatus for heating at least one of said at least one solder ball and said at least one conductive contact site to a submelting solder softening temperature $T_s$.

47. The apparatus of claim 46, wherein each of said array of conductive contact sites comprises a substantially flat surface.

48. The apparatus of claim 46, wherein each of said array of conductive contact sites comprises an indentation for receiving a portion of said at least one solder ball.

49. The apparatus of claim 46, wherein each of said array of conductive contact sites comprises an indentation having at least one projection extending thereinto.

50. A testing apparatus for a semiconductor assembly having a ball grid array of solder balls on a surface thereof, said apparatus comprising:

an insert formed of one of silicon and ceramic material, said insert having a first surface including an array of conductive contact sites for contact with at least one solder ball of said ball grid array of solder balls and having a second surface;

a substrate having a first surface, a second surface, said second surface of said insert attached to said first surface of said substrate, and a pattern of leads on said substrate for connection to contact leads in a socket;

electrical leads connecting said array of conductive contact sites of said insert to said pattern of leads on said substrate;

a test board having said socket and having said contact leads connected to a testing circuit, said substrate and said insert for insertion into said socket for electrical contact of said pattern of leads of said substrate with said contact leads of said socket;

heating apparatus associated with at least one of said substrate, said insert and said socket; and at least one power supply lead providing electrical power to said heating apparatus.

51. The apparatus of claim 50, wherein said heating apparatus comprises at least one resistance conductor.

52. The apparatus of claim 50, further comprising a switch apparatus connected to said heating apparatus for turning said heating apparatus on and off.

53. The apparatus of claim 50, further comprising temperature sensing apparatus attached to one of said substrate, said insert, and said semiconductor assembly.

54. The apparatus of claim 53, further comprising a temperature controller for controlling said heating apparatus.

55. The apparatus of claim 53, wherein said temperature sensing apparatus comprises a thermocouple junction.

56. The apparatus of claim 50, wherein said heating apparatus includes a conductive layer of metal deposited on one of said first and second surfaces of said substrate.

57. The apparatus of claim 50, wherein said heating apparatus, said at least one power supply lead and said pattern of leads are formed on said substrate.

58. A temporary connection apparatus for connecting at least one solder ball on a first member to at least one corresponding contact site on a second member, said second member connected to a third member, said apparatus comprising:

a board having a socket for accepting said first member, said second member, and said third member, said board having at least two through-holes extending therethrough and having first and second through-hole axes generally perpendicular to said board;

at least one heating conductor mounted on an underside of said third member, said at least one heating conductor having junctions positioned intercepting said first and second through-hole axes of said at least two through-holes extending through said board;

at least one spring-loaded pogo pin mounted to project a pin portion upwardly thereof through each of said at least two through-holes of said board to contact said third member; and at least one power lead for connecting said at least one spring-loaded pogo pin to a power supply for heating said first member, said second member, and said third member including at least one of said at least one solder ball and said at least one corresponding contact site.

59. The apparatus of claim 58, further comprising a temperature sensor mounted within said first, second and third members connected to a temperature measuring circuit.

* * * * *

UNITED STATES PATENT AND TRADEMARK OFFICE
CERTIFICATE OF CORRECTION

PATENT NO. : 6,614,003 B2
DATED : September 2, 2003
INVENTOR(S) : Daid R. Hembree and Warren M. Farnworth It is certified that error appears in the above-identified patent and that said Letters Patent is hereby corrected as shown below:

Drawings,
Figure 1, delete "31" and delete "{" (as shown on the attached page)

Column 2,
Line 62, change "bum-in" to -- burn-in --

Column 3,
Line 26, change "bum-in" to -- burn-in --

Column 4,
Line 21, after "and" insert -- conductive --
Line 23, change "bum-in" to -- burn-in --
Line 26, change "bum-" to -- burn --

Signed and Sealed this

Seventh Day of September, 2004

JON W. DUDAS
*Director of the United States Patent and Trademark Office*